(12) United States Patent
Yosho

(10) Patent No.: US 7,476,605 B2
(45) Date of Patent: Jan. 13, 2009

(54) METHOD OF MANUFACTURING SEMICONDUCTOR DEVICE

(75) Inventor: Takeshi Yosho, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 456 days.

(21) Appl. No.: 11/414,357

(22) Filed: May 1, 2006

(65) Prior Publication Data

US 2006/0286795 A1     Dec. 21, 2006

(30) Foreign Application Priority Data

Jun. 21, 2005     (JP)     ............................. 2005-180728

(51) Int. Cl.
*H01L 21/44* (2006.01)

(52) U.S. Cl. .................. 438/597; 438/540; 438/618; 438/626; 438/635; 438/653; 438/680; 438/687; 257/E21.579

(58) Field of Classification Search .................. 438/540, 438/635

See application file for complete search history.

(56) References Cited

U.S. PATENT DOCUMENTS

2004/0175931 A1*  9/2004  Nishibe et al. ............... 438/630

FOREIGN PATENT DOCUMENTS

JP      2005-217223      8/2005

* cited by examiner

*Primary Examiner*—N Drew Richards
*Assistant Examiner*—Kyoung Lee
(74) *Attorney, Agent, or Firm*—Finnegan, Henderson, Farabow, Garrett & Dunner, L.L.P.

(57) ABSTRACT

A method for manufacturing a semiconductor device is provided, which comprises forming a first metal wiring layer above a semiconductor substrate, forming an inorganic insulating film above the first metal wiring layer, forming an organic insulating film on the inorganic insulating film, forming a recess in the organic insulating film, forming a reactive layer on the side surface of the recess, the reactive layer being capable of reaction under heat with the organic insulating film, applying a heat treatment to the reactive layer so as to permit the reactive layer to react with the organic insulating film while leaving an unreacted reactive layer, thereby allowing the reaction layer to grow on the side surface of the recess, the recess being diminished by the growth of the reaction layer, and removing the unreacted reactive layer to obtain a diminished recess.

20 Claims, 3 Drawing Sheets

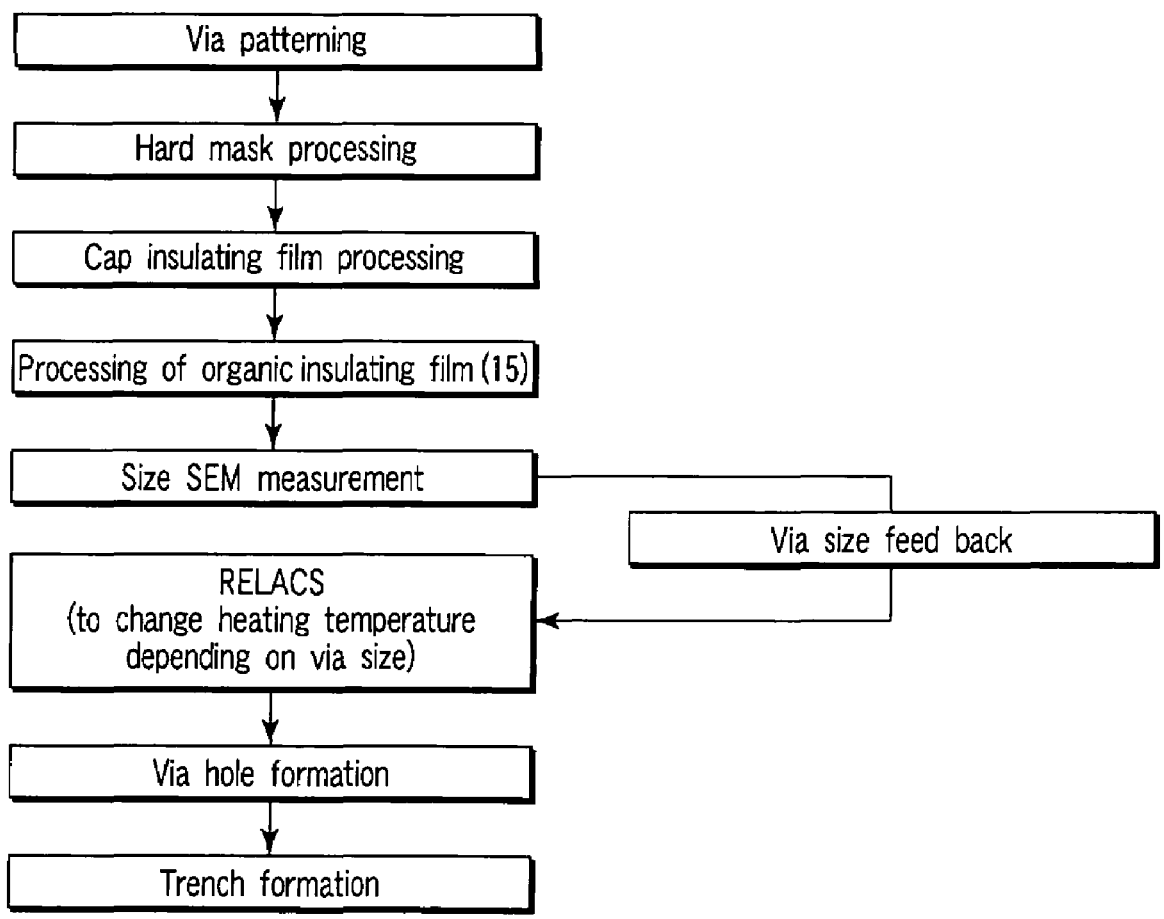
F I G. 16

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-180728, filed Jun. 21, 2005, the entire contents of which are incorporated herein by reference.

BACKGROUND OF THE INVENTION

1. Field of the Invention

The present invention relates to a method for manufacturing a semiconductor device, particularly, to a method for manufacturing a semiconductor device having a dual damascene wiring structure using an interlayer insulating film which has a low dielectric constant and is formed of an organic insulating film.

2. Description of the Related Art

Miniaturization of a metal wiring is being promoted in an attempt to comply with the demands for the further improvement in the switching speed of a semiconductor device. In addition, miniaturization of the via hole for connecting the adjacent metal wiring layers and the lowering in the dielectric constant of the interlayer insulating film are said to be critical for further improving the switching speed of the semiconductor device.

However, the size that can be obtained by the processing is limited if the processing size is to be miniaturized by simply improving the capability of the lithography technology employed for forming a trench in which the metal wiring is to be buried and for forming a via hole for connecting the adjacent metal wiring layers. In such the situation, the processing with a desired small size is being made difficult. It should also be noted that a hybrid structure including an organic insulating film and an inorganic insulating film is employed as an insulating film formed between the adjacent metal wiring layers, and a laminate structure is employed in the hard mask that is used for performing the dry etching. In addition, a cap insulating film is formed on the metal wiring layer and on the insulating film having a low dielectric constant. As a result, the construction of semiconductor device is made more complex. Under the circumstances, the nonuniformity of the size caused by the fluctuation of the etching rate has come to be attracted attention as a problem to be solved in applying a dry etching to various insulating films.

BRIEF SUMMARY OF THE INVENTION

A method for manufacturing a semiconductor device according to one aspect of the present invention comprises forming a first metal wiring layer above a semiconductor substrate; forming an inorganic insulating film above the first metal wiring layer; forming an organic insulating film on the inorganic insulating film; forming a recess in the organic insulating film; forming a reactive layer on a side surface of the recess, the reactive layer being capable of reaction under heat with the organic insulating film; applying a heat treatment to the reactive layer so as to permit the reactive layer to react with the organic insulating film while leaving an unreacted reactive layer, thereby allowing the reaction layer to grow on the side surface of the recess, the recess being diminished by the growth of the reaction layer; and removing the unreacted reactive layer to obtain a diminished recess.

A method for manufacturing a semiconductor device according to another aspect of the present invention comprises forming a first metal wiring layer above a semiconductor substrate; forming an inorganic insulating film above the first metal wiring layer; forming an organic insulating film on the inorganic insulating film; forming a via pattern as a recess in the organic insulating film; forming a reactive layer on a side surface of the via pattern, the reactive layer being capable of reaction under heat with the organic insulating film; applying a heat treatment to the reactive layer so as to permit the reactive layer to perform a reaction with the organic insulating film while leaving an unreacted reactive layer, thereby allowing a reaction layer to grow on the side surface of the via pattern, the via pattern being diminished by the growth of the reaction layer; removing the unreacted reactive layer to obtain a diminished via pattern; transferring the diminished via pattern formed in the organic insulating film into the inorganic insulating film so as to expose the first metal wiring, thereby forming the via hole; and forming a wiring trench in the organic insulating film to remove the reaction layer.

A method for manufacturing a semiconductor device according to another aspect of the present invention comprises forming a first metal wiring layer above a semiconductor substrate; forming an inorganic insulating film above the first metal wiring layer; forming an organic insulating film on the inorganic insulating film; forming a via hole in the inorganic insulating film so as to expose the first metal wiring; forming a wiring trench as a recess in the organic insulating film; forming a reactive layer on a side surface of the wiring trench, the reactive layer being capable of reaction under heat with the organic insulating film; applying a heat treatment to the reactive layer so as to permit the reactive layer to react with the organic insulating film while leaving an unreacted reactive layer, thereby allowing a reaction layer to grow on the side surface of the wiring trench, the wiring trench being diminished by the growth of the reaction layer; and removing the unreacted reactive layer to obtain a diminished wiring trench.

BRIEF DESCRIPTION OF THE SEVERAL VIEWS OF THE DRAWING

FIG. 16 is an APC (Auto Process Control) flow chart.

DETAILED DESCRIPTION OF THE INVENTION

Examples of the present invention will now be described. Needless to say, the technical scope of the present invention is not limited to the following Examples.

EXAMPLE 1

Figure 1:
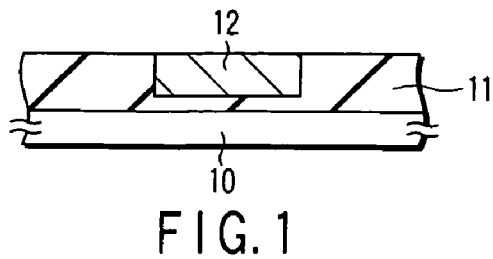
FIG. 1 is a cross sectional view showing a step of a manufacturing method of a semiconductor device according to one embodiment of the present invention.

In the first step, a first metal wiring layer 12 is formed on a Si substrate 10, as shown in FIG. 1. The first metal wiring layer 12 can be formed by the following method. A resist pattern having a trench pattern is formed on an insulating film 11 that is formed on an element (not shown) formed on the Si substrate 10, followed by applying a dry etching treatment to the insulating film 11, with the resist pattern used as a mask, so as to form a wiring trench in the insulating film 11. Then, a barrier metal material is deposited on the entire surface including the wiring trench formed in the insulating film 11, followed by depositing a wiring material on the entire surface of the barrier metal layer by the sputtering method and a plating method. It is possible to use, for example, Cu as the wiring material. Alternatively, Au or W can also be used as the wiring material in place of Cu. Finally, the wiring material layer and the barrier metal material layer formed on the insulating film 11 are removed by CMP to bury the wiring trench with the first metal wiring 12.

In the next step, a cap insulating film 13 such as a SICN film is formed on the entire surface by a P-CVD method, followed by forming a hybrid insulating film 16 on the cap insulating film 13. It is desirable for the hybrid insulating film 16 to include an insulating film having a low dielectric constant, i.e., having a relative dielectric constant not higher than 3.5. In this Example, the hybrid insulating film 16 is of a laminate structure comprising an inorganic insulating film 14 formed of SiOC and an organic insulating film 15 formed of PAE (polyarylene ether). The hybrid structure of the insulating film 16 makes it possible to increase the etching selectivity to 2.0 or more in the subsequent step of forming a via hole. Incidentally, the organic insulating film 15 contains a carboxylic acid as an acid component.

Figure 2:
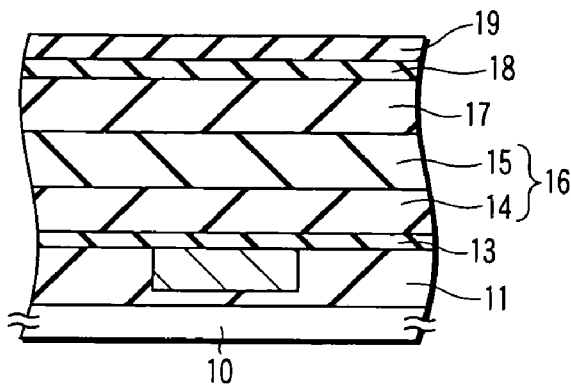
FIG. 2 is a cross sectional view showing a manufacturing step of the semiconductor device following the step shown in FIG. 1.

Further, a cap insulating film 17, a first hard mask 18 and a second hard mask 19 are formed successively in the order mentioned on the hybrid insulating film 16. The cap insulating film 17 is formed by depositing $SiH_4$. The first hard mask 18 is formed by using SiN and the second hard mask 19 is formed by using $SiO_2$. In this fashion, the structure as shown in FIG. 2 is obtained.

Figure 3:
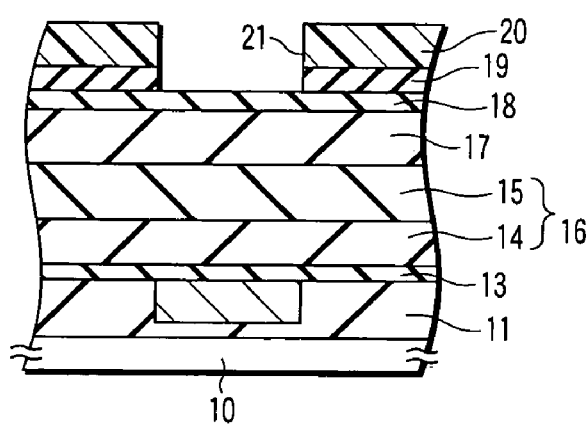
FIG. 3 is a cross sectional view showing a manufacturing step of the semiconductor device following the step shown in FIG. 2.

In the next step, a resist film is formed by the ordinary method on the second hard mask 19, followed by forming a trench pattern 21 having a width of 130 nm in the resist film by the lithography method so as to form a resist pattern 20. Then, a dry etching is applied to the second hard mask 19 by using the resist pattern 20 as a mask so as to selectively remove by etching the second hard mask 19 as shown in FIG. 3.

Figure 4:
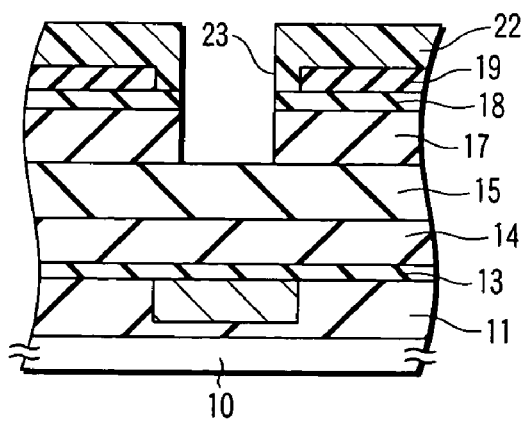
FIG. 4 is a cross sectional view showing a manufacturing step of the semiconductor device following the step shown in FIG. 3.

Further, the resist pattern 20 is removed by using an $O_2$ asher, followed by forming a resist film on the entire surface. Then, a via pattern 23 is formed in the resist film by the lithography method so as to form a resist pattern 22. The via pattern 23 is sized to a diameter of 120 nm. Further, a dry etching is applied to the first hard mask 18 and the cap insulating film 17 by using the resist pattern 22 as a mask, thereby selectively removing the first hard mask 18 and the cap insulating film 17 as shown in FIG. 4.

Figure 5:
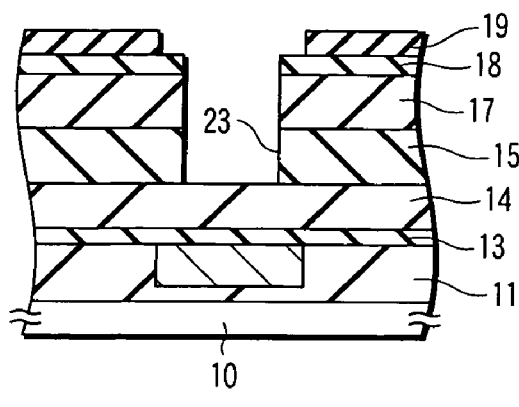
FIG. 5 is a cross sectional view showing a manufacturing step of the semiconductor device following the step shown in FIG. 4.
Figure 6:
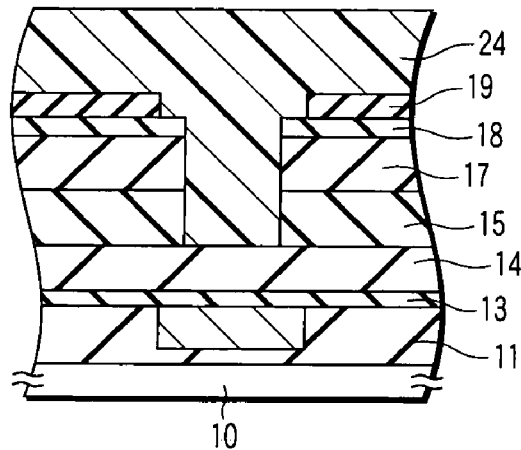
FIG. 6 is a cross sectional view showing a manufacturing step of the semiconductor device following the step shown in FIG. 5.

Further, a dry etching is applied to the organic insulating film 15 so as to form the via pattern 23 in the shape of a recess having a diameter of 120 nm into the organic insulating film 15 as shown in FIG. 5.

Figure 7:
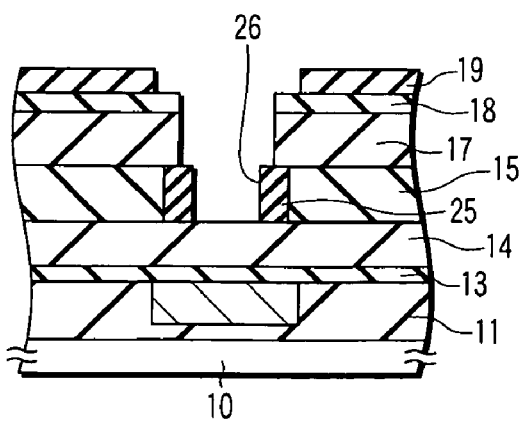
FIG. 7 is a cross sectional view showing a manufacturing step of the semiconductor device following the step shown in FIG. 6.
Figure 8:
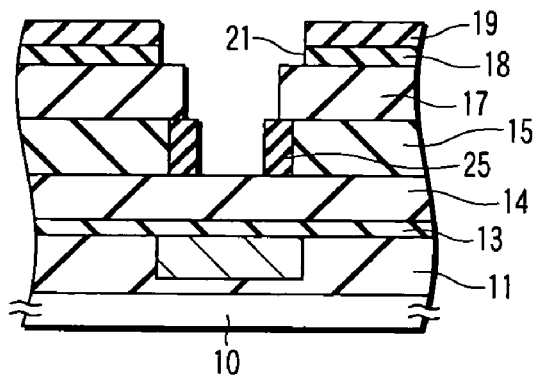
FIG. 8 is a cross sectional view showing a manufacturing step of the semiconductor device following the step shown in FIG. 7.

In the next step, the entire surface is coated with a water soluble pattern shrinking agent so as to form a reactive layer 24. The reactive layer 24 is formed on at least a side surface of the via pattern 23. It is possible to use, for example, RELACS (Resolution Enhancement Lithography Assisted by Chemical Shrink) material as the pattern shrinking agent. Then, a heat treatment is applied to the reactive layer 24 by using a hot plate at 130° C. for 3 minutes under the air atmosphere. As a result, a reaction is carried out between the RELACS material and the acid component contained in the organic insulating film 15 so as to form a reaction layer 25 on the side surface of the via pattern 23. Formation of the particular reaction layer 25 is called a shrinking treatment. It is possible to change the temperature of the heat treatment within a range of 100 to 170° C., and the time for the heat treatment can be set at about 1 to 5 minutes. The unreacted reactive layer 24 is removed as shown in FIG. 7 by performing a rinsing treatment with water. By the formation of the reaction layer 25 on the side surface of the via pattern 23, the diameter of the via pattern is decreased to 100 nm, thereby forming a diminished via pattern 26. It is confirmed that the reaction layer 25 grown on the inner surface of the via pattern 23 has a thickness of about 10 nm. It is possible to obtain the via pattern 26 diminished to a desired size by increasing the thickness of the reaction layer 25 grown on the inner surface of the via pattern 23. It is possible to control the thickness of the reaction layer 25 by controlling the temperature, time, etc. of the heat treatment. Further, a dry etching is applied to the first hard mask 18 so as to transfer the trench pattern 21 into the first hard mask 18 as shown in FIG. 8.

Figure 9:
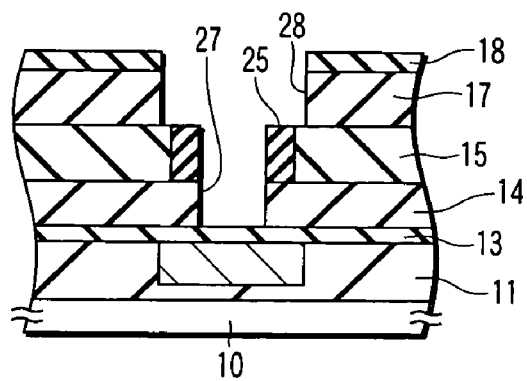
FIG. 9 is a cross sectional view showing a manufacturing step of the semiconductor device following the step shown in FIG. 8.

In the next step, a dry etching is applied selectively to the inorganic insulating film 14 so as to form a via hole 27 in the inorganic insulating film 14 as shown in FIG. 9. Further, an additional dry etching is applied to the cap insulating film 17 so as to form a wiring trench 28 in the cap insulating film 17. The second hard mask 19 is removed simultaneously in the stage of selectively etching the inorganic insulating film 14.

Figure 10:
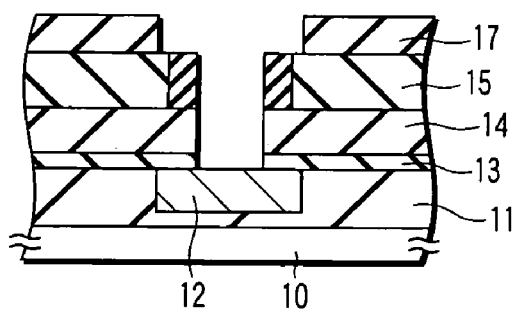
FIG. 10 is a cross sectional view showing a manufacturing step of the semiconductor device following the step shown in FIG. 9.

Then, the cap insulating film 13 at the bottom of the via hole 27 is removed by selectively applying a dry etching treatment to the cap insulating film 13 so as to expose the first metal wiring layer 12 to the outside as shown in FIG. 10. In this etching stage, the first hard mask 18 is also removed simultaneously.

Figure 11:
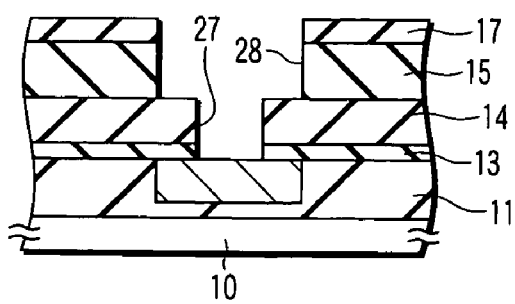
FIG. 11 is a cross sectional view showing a manufacturing step of the semiconductor device following the step shown in FIG. 10.

In the next step, a dry etching is applied selectively to the organic insulating film 15 so as to transfer the wiring trench 28 into the organic insulating film 15 as shown in FIG. 11. In this etching stage, a RIE treatment is carried out under the $NH_3$ gas condition in order to remove the reaction layer 25, with the result that the reaction layer 25 is removed simultaneously in the stage of transferring the wiring trench 28 into the organic insulating film 15. Because of application of this particular RIE treatment, the thickness of the cap insulating film 17 is also decreased as shown in the drawing.

Figure 12:
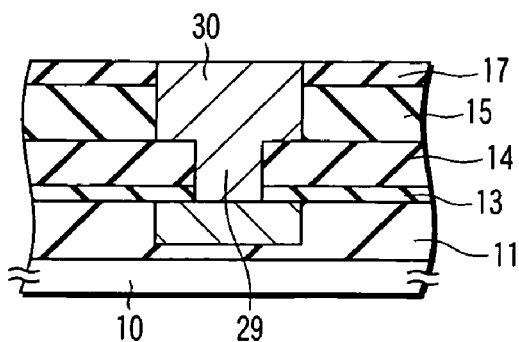
FIG. 12 is a cross sectional view showing a manufacturing step of the semiconductor device following the step shown in FIG. 11.

Further, a barrier metal layer (not shown) is formed on the side wall and the bottom of the via hole and the wiring trench thus formed, followed by depositing a wiring material on the barrier metal layer so as to form a plug 29 and a second metal wiring layer 30 as shown in FIG. 12. It is possible to select the wiring material from the group consisting of, for example, Cu, Al and W.

In Example 1 described above, a shrinking treatment is performed in forming the via hole so as to make it possible to form a very small via hole having a diameter of 100 nm or less.

EXAMPLE 2

Figure 13:
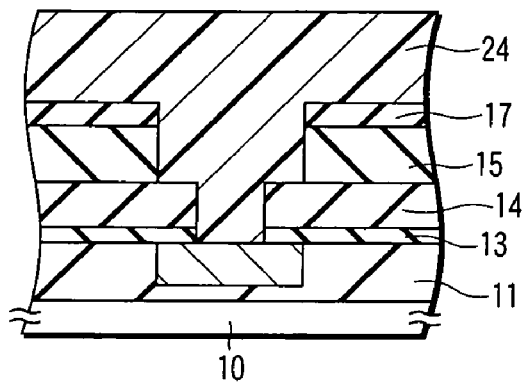
FIG. 13 is a cross sectional view showing a step of a manufacturing method of a semiconductor device according to another embodiment of the present invention.

The construction as shown in FIG. 11 is obtained by a method similar to that in Example 1. As shown in FIG. 11, a wiring trench 28 is formed as a recess in the organic insulating film 15. Incidentally, the via hole is formed to extend through the inorganic insulating film 14 and the cap insulating film 13 by a method similar to that described above. In the next step, the entire surface is coated with a water soluble pattern shrinking agent so as to form a reactive layer 24 as shown in FIG. 13. It is possible to use, for example, RELACS material referred to previously as the pattern shrinking agent. Then, a heat treatment is applied to the reactive layer 24 by using a hot plate at 130° C. for 3 minutes under the air atmosphere. As a result, the RELACS material is allowed to react with the acid component contained in the organic insulating film 15 so as to form a reaction layer 25 on the side surface of the wiring trench 28.

Figure 14:
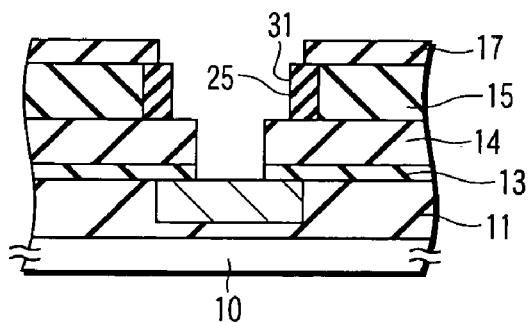
FIG. 14 is a cross sectional view showing a manufacturing step of the semiconductor device following the step shown in FIG. 13.

In the next step, the unreacted reactive layer 24 is removed as shown in FIG. 14 by applying a rinsing treatment with water. The diameter of the wiring trench 28 is decreased to 100 nm by the formation of the reaction layer 25 on the side surface of the wiring trench 28 so as to form a diminished wiring trench 31. It is confirmed that the reaction layer 25 grown on the inner surface of the wiring trench 28 has a thickness of about 15 nm. As in the case of the via pattern 23 referred to in Example 1, it is possible to obtain the wiring trench 31 diminished to a desired size by increasing the thickness of the reaction layer 25 grown on the inner surface of the wiring trench 28. As described previously, the thickness of the reaction layer 25 can be controlled by controlling the temperature and time of the heat treatment.

Figure 15:
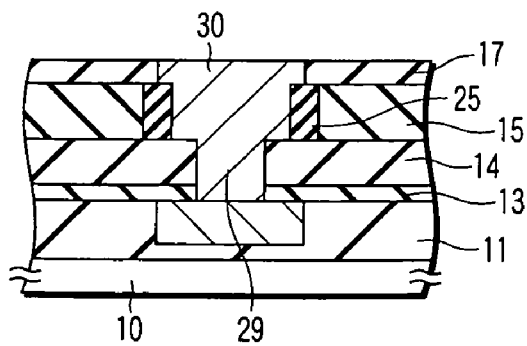
FIG. 15 is a cross sectional view showing a manufacturing step of the semiconductor device following the step shown in FIG. 14.

In the next step, a barrier metal layer (not shown) is formed on the side wall and the bottoms of the via hole 27 and the diminished wiring trench 31 thus formed, followed by depositing a wiring material on the barrier metal layer so as to form a plug 29 and a second metal wiring layer 30 as shown in FIG. 15.

In Example 2, a shrinking treatment is applied to the wiring trench formed in the organic insulating film so as to make it possible to form a very small metal wiring layer having a width of 100 nm or less.

EXAMPLE 3

In each of Examples 1 and 2 described above, the sizes of the via hole and the wiring trench are measured in advance before application of the shrinking treatment to the organic insulating film. The sizes of the via hole and the wiring trench are deviated by the application of an etching treatment such as RIE to each of the insulating films. The reaction layer having a desired thickness is formed by changing the heating temperature for the shrinking treatment in accordance with the amount of the deviation. In this fashion, the deviation of the size generated in the via hole and the wiring trench is corrected.

Where the heating temperature in the stage of the shrinking treatment is high, i.e., not lower than 170° C., the reaction layer is allowed to have a thickness of about 15 nm. In Example 3, the heating temperature is changed within a range of 100 to 170° C. so as to form a reaction layer having a desired thickness.

In the next step, the wiring trench and the via hole are formed by an ordinary method of a dry etching process, followed by burying the wiring material in the wiring trench and the via hole, with a barrier metal layer formed below the wiring material layer. Further, CMP is applied to the laminate structure consisting of the barrier metal layer and the wiring material layer so as to form a dual damascene wiring structure. By employing the aforementioned method, it is possible to decrease the nonuniformity in the sizes of the wiring trench for the second metal wiring layer and the diameter of the via hole.

The technique for Example 3 is effective as APC (Auto Process Control). FIG. 16 is a flow chart showing the APC flow. As shown in the drawing, the via patterning, the hard mask processing, the cap insulating film processing, the organic insulating film processing and the size SEM measurement are carried out successively, followed by feeding back the via size. In other words, the shrinking treatment is applied by changing the treating (heating) temperature in accordance with the via size. In the subsequent steps, the via hole formation and the wiring trench formation are carried out successively.

As described above, the present invention makes it possible to form a fine metal wiring and a fine via hole, the fineness exceeding the limits in the case of employing the lithography technique. Further, it is possible to form a dual damascene wiring having a suppressed nonuniformity of the size by correcting the deviation of the size generated by the dry etching in the steps of forming the wiring trench and the via hole.

According to an embodiment of the present invention, provided is a method of manufacturing a semiconductor device that permits forming a fine metal wiring and a fine via hole without giving rise to a nonuniformity of the size so as to manufacture a semiconductor device having a decreased nonuniformity of the size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:

forming a first metal wiring layer above a semiconductor substrate;

forming an inorganic insulating film above the first metal wiring layer;

forming an organic insulating film on the inorganic insulating film;

forming a recess in the organic insulating film;

forming a reactive layer on a side surface of the recess, the reactive layer being capable of reaction under heat with the organic insulating film;

applying a heat treatment to the reactive layer so as to permit the reactive layer to react with the organic insulating film while leaving an unreacted reactive layer, thereby allowing the reaction layer to grow on the side surface of the recess, the recess being diminished by the growth of the reaction layer; and removing the unreacted reactive layer to obtain a diminished recess.

2. The method according to claim 1, wherein the diminished recess is provided by a via pattern, and further comprising transferring the diminished recess formed in the organic insulating film into the inorganic insulating film, and forming a wiring trench in the organic insulating film.

3. The method according to claim 2, further comprising burying a wiring material inside the via hole and the wiring trench, with a barrier metal layer formed below the wiring material layer, thereby forming a plug and a second metal wiring layer.

4. The method according to claim 3, wherein the wiring material is at least one selected from the group consisting of Cu, Al and W.

5. The method according to claim 1, wherein the recess is provided by a wiring trench and further comprising forming a via hole in the inorganic insulating film before forming the reactive layer.

6. The method according to claim 5, further comprising burying a wiring material inside the via hole and the wiring trench, with a barrier metal layer formed below the wiring material layer, thereby forming a plug and a second metal wiring layer.

7. The method according to claim 6, wherein the wiring material is at least one selected from the group consisting of Cu, Al and W.

8. A method for manufacturing a semiconductor device, comprising forming a first metal wiring layer above a semiconductor substrate;

forming an inorganic insulating film above the first metal wiring layer;

forming an organic insulating film on the inorganic insulating film;

forming a via pattern as a recess in the organic insulating film;

forming a reactive layer on a side surface of the via pattern, the reactive layer being capable of reaction under heat with the organic insulating film;

applying a heat treatment to the reactive layer so as to permit the reactive layer to perform a reaction with the organic insulating film while leaving an unreacted reactive layer, thereby allowing a reaction layer to grow on the side surface of the via pattern, the via pattern being diminished by the growth of the reaction layer;

removing the unreacted reactive layer to obtain a diminished via pattern;

transferring the diminished via pattern formed in the organic insulating film into the inorganic insulating film so as to expose the first metal wiring, thereby forming the via hole; and forming a wiring trench in the organic insulating film to remove the reaction layer.

9. The method according to claim 8, wherein the organic insulating film comprises an acid component.

10. The method according to claim 8, wherein the heat treatment is performed by heating the semiconductor substrate to 100 to 170° C.

11. The method according to claim 10, wherein the heating is performed for 1 to 5 minutes.

12. The method according to claim 8, wherein the removing the unreacted reactive layer is performed by rinsing with water.

13. The method according to claim 8, further comprising burying a wiring material inside the via hole and the wiring trench, with a barrier metal layer formed below the wiring material layer, thereby forming a plug and a second metal wiring layer.

14. A method for manufacturing a semiconductor device, comprising forming a first metal wiring layer above a semiconductor substrate;

forming an inorganic insulating film above the first metal wiring layer;

forming an organic insulating film on the inorganic insulating film;

forming a via hole in the inorganic insulating film so as to expose the first metal wiring;

forming a wiring trench as a recess in the organic insulating film;

forming a reactive layer on a side surface of the wiring trench, the reactive layer being capable of reaction under heat with the organic insulating film;

applying a heat treatment to the reactive layer so as to permit the reactive layer to react with the organic insulating film while leaving an unreacted reactive layer, thereby allowing a reaction layer to grow on the side surface of the wiring trench, the wiring trench being diminished by the growth of the reaction layer; and removing the unreacted reactive layer to obtain a diminished wiring trench.

15. The method according to claim 14, wherein the organic insulating film comprises an acid component.

16. The method according to claim 14, wherein the heat treatment is performed by heating the semiconductor substrate to 100 to 170° C.

17. The method according to claim 16, wherein the heating is performed for 1 to 5 minutes.

18. The method according to claim 13, wherein the removing the unreacted reactive layer is performed by rinsing with water.

19. The method according to claim 13, further comprising burying a wiring material inside the via hole and the wiring trench, with a barrier metal layer formed below the wiring material, thereby forming a plug and a second metal wiring.

20. The method according to claim 14, wherein the via hole is formed by:

forming a via pattern in the organic insulating film;

forming a reactive layer on a side surface of the via pattern, the reactive layer being capable of reaction under heat with the organic insulating film;

applying a heat treatment to the reactive layer so as to permit the reactive layer to react with the organic insulating film, thereby allowing a reaction layer to grow on the side surface of the via pattern, the via pattern being diminished by the growth of the reaction layer;

removing the unreacted reactive layer to obtain a diminished via pattern; and transferring the diminished via pattern formed in the organic insulating film into the inorganic insulating film.

* * * * *